United States Patent [19]

Cannella et al.

[11] Patent Number: 4,660,095

[45] Date of Patent: Apr. 21, 1987

[54] CONTACT-TYPE DOCUMENT SCANNER AND METHOD

[75] Inventors: Vincent D. Cannella, Birmingham; Zvi Yaniv, Southfield; Robert R. Johnson, Franklin, all of Mich.

[73] Assignee: Energy Conversion Devices, Inc., Troy, Mich.

[21] Appl. No.: 607,153

[22] Filed: May 4, 1984

[51] Int. Cl.[4] .................................. H04N 1/024
[52] U.S. Cl. ............................ 358/294; 358/213; 357/24
[58] Field of Search .................. 358/213, 294, 212; 357/24 LR; 250/578

[56] References Cited

U.S. PATENT DOCUMENTS

| | | | |
|---|---|---|---|
| 3,603,731 | 9/1971 | Weimer | 358/213 |
| 3,696,250 | 10/1972 | Weimer | 358/213 |
| 4,067,046 | 1/1978 | Nakatani et al. | 358/213 |
| 4,149,197 | 4/1979 | Kos et al. | 358/294 |
| 4,226,898 | 10/1980 | Ovshinsky et al. | 357/2 |
| 4,390,791 | 6/1983 | Hatanaka et al. | 250/578 |
| 4,453,184 | 6/1984 | Hamakawa et al. | 358/213 |
| 4,482,804 | 11/1984 | Oritsuki et al. | 358/213 |

OTHER PUBLICATIONS

H. Yamamoto et al., "High Speed Contact Type Linear Sensor Array Using a-Si pin Diodes" Extended Abstracts, 15th Conf. on Solid-State Devices & Materials, Tokyo, 1983, pp. 205-208.

Primary Examiner—Gene Z. Rubinson
Assistant Examiner—Stephen Brinich
Attorney, Agent, or Firm—Marvin S. Siskind; Richard O. Gray; Ronald W. Citkowski

[57] ABSTRACT

There is disclosed an apparatus and method for providing electrical signals representative of an image projected thereon. The apparatus includes an array of spaced apart, light sensitive elements formed from deposited semiconductor material and arranged for receiving said image. The elements are capable of effecting a detectable electrical characteristic responsive to the intensity of light received thereon from the image. The apparatus further includes isolation means for enabling the selective detection of the electrical characteristic of each element.

103 Claims, 9 Drawing Figures

CONTACT-TYPE DOCUMENT SCANNER AND METHOD

FIELD OF THE INVENTION

The present invention generally relates to an apparatus and method for providing electrical signals representative of an image. The present invention more particularly relates to an apparatus and method for providing electrical signals representative of an image carried by an image-bearing member such as a printed document wherein the image is formed by high and low optical density portions.

BACKGROUND OF THE INVENTION

Systems are known for converting an image, such as characters of a document, to electrical signals which can be stored in a memory for later recall or transmitted to a remote location over, for example, telephone communication or similar systems. Systems of this type have generally been referred to as line scanners. In one type of line scanner, the document is held stationary and a photodetector or detectors are scanned across each line of the document along with a localized light source. In another type of scanner, the photodetector and light source are held stationary and the document is moved. In both types of systems, as the document is scanned, the high optical density or dark portions of the document reflect less light from the light source into the detector than the low optical density or light portions. As a result, the high and low optical density portions can be contrasted by the photodetector for generating electrical signals representative of the character images of the document.

While systems of the type above have been generally successful in fulfilling their intended purposes and have found commercial acceptance, these systems have exhibited several deficiencies. For example, line scanner systems are rather complex. They require mechanical drive and servo systems to precisely control the movement of the photosensor and light source relative to the document being scanned to enable accurate data storage or transmission of the electrical signals for the ultimate faithful reproduction of the document. When a single detector and light source are used, these mechanical drives and servo systems must accurately control such relative movement both across the document and down the length of the document.

When a plurality of colinear detectors and light sources are employed to enable line-by-line scanning of a document, fiber optics are generally used to convey light to operative association with each detector. Hundreds of individual detectors and corresponding optical fibers are required for such operation. This not only adds to the complexity of the overall system, but in addition, introduces fiber optic coupling problems as well.

Prior art line scanners also require frequent or periodic servicing. This results due to their complexity and the incorporation of moving parts which are subject to wear.

In addition to the foregoing, prior art line scanners require a significant period of time to scan a document. This is due to the fact that the mechanical moving parts can only be driven at a speed which precludes damage to the moving parts and which ensures proper synchronization with a companion printer or data input storage. Scanners of the prior art are therefore extremely inconvenient to use when a document of many pages must be scanned.

Lastly, prior art scanners are bulky in terms of size and heavy. This is due to the rather heavy mechanical parts incorporated therein and most particularly the motor or motors utilized for driving the moving parts. Hence, prior art scanners do not lend themselves to portability and generally can only be used at a fixed location.

SUMMARY OF THE INVENTION

The invention therefore provides a new and improved apparatus and method for providing electrical signals representative of an image projected onto the apparatus. The present invention, in accordance with one embodiment, provides a contact-type page scanner which does not include any moving parts and which is adapted to electronically scan a document or other image-bearing member placed thereon. The contact-type page scanner embodying the present invention is therefore both light in weight and compact, lending itself to portable use.

The present invention therefore provides an apparatus for providing electrical signals representative of an image thereon which includes an array of spaced apart, light sensitive elements formed from deposited semiconductor material and arranged for receiving said image. The elements are capable of effecting a detectable electrical characteristic responsive to the intensity of light received thereon from the image. The apparatus further includes isolation means for enabling the selective detection of the electrical characteristic of each element.

The present invention more particularly provides an apparatus for providing electrical signals representative of an image having light and dark portions carried by an image-forming member. The apparatus includes a transparent substrate, a first set of address lines, and a second set of address lines spaced from and crossing at an angle to the first set of address lines to form a plurality of crossover points. The apparatus further includes a plurality of light sensitive elements formed and distributed on the substrate and in spaced apart relation, each light sensitive element being associated with a given one of the crossover points and arranged to effect a detectable change in electrical conductivity in response to receipt of incident light, and an isolation device associated with each light sensitive element to facilitate the selective addressing and detection of the electrical conductivity of each light sensitive element by the application of read potentials to respective pairs of the first and second sets of address lines. The apparatus further includes transparent cover means overlying the light sensitive elements and including a substantially planar surface opposite the light sensitive elements for receiving the image-bearing member thereon in close juxtaposed relation to the light sensitive elements.

The light sensitive elements can comprise, for example, photovoltaic cells or photoresistors. The light sensitive elements can be formed from deposited semiconductor material, and preferably from an amorphous semiconductor alloy.

The isolation devices can comprise diodes or field effect transistors, for example. The isolation devices can also be formed from deposited semiconductor material and preferably an amorphous semiconductor alloy.

The present invention still further provides a method of generating electrical signals representative of an image. The method includes the steps of providing an array of light sensitive elements capable of effecting a detectable change in electrical conductivity responsive to the receipt of light thereon in spaced apart relation, projecting the image onto the array of light sensitive elements, and selectively applying read potentials to the light sensitive elements for detecting the electrical conductivity of the elements and deriving an electrical signal for each element representative of the electrical conductivity of each element.

The method can include the further step of dividing the elements into groups of elements and applying the read potentials to each group of elements in parallel while the image is projected onto the array of elements. The read potentials can be serially applied to the elements within each group of elements.

The present invention further provides a method of generating electrical signals representative of an image formed by high and low optical density portions on one side of an image-bearing member. The method includes the steps of providing an array of light sensitive elements capable of effecting a detectable change in electrical conductivity responsive to the receipt of light thereon in spaced apart substantially coplanar relation, placing the image-bearing member over the array of elements with the one side of the member adjacent the array of elements, projecting light onto the one side of the member so that the image portions of low optical density reflect light onto the elements adjacent thereto and the image portions of high optical density reflect substantially less light onto the elements adjacent thereto than reflected by the portions of low optical density, and selectively applying read potentials to the light sensitive elements for detecting the electrical conductivity of the elements and deriving an electrical signal for each element representative of the optical density of the image portion adjacent thereto.

Preferably, the one side of the image-bearing member is placed in closely spaced, juxtaposed relation to the array of elements and the light is projected onto the one side of the image-bearing member through the spaces between the elements.

The present invention further provides an apparatus for providing electrical signals which also represent the color hues of an image. To that end, primary colored light sources of red, green, and blue light can be sequentially projected onto the image-bearing member. The electrical signals provided by each light sensitive element can thereafter be correlated to derive the proper color hue of the portion of the image-bearing member adjacent each light sensitive element.

DESCRIPTION OF THE PREFERRED EMBODIMENTS

Figure 1:
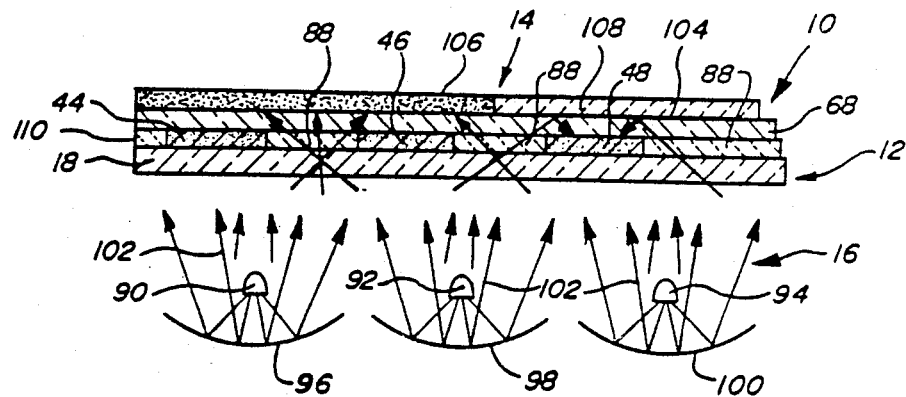
FIG. 1 is a partial side view, partly in cross section, of a contact-type document scanner system and apparatus embodying the present invention with a document to be scanned disposed over the apparatus.
Figure 2:
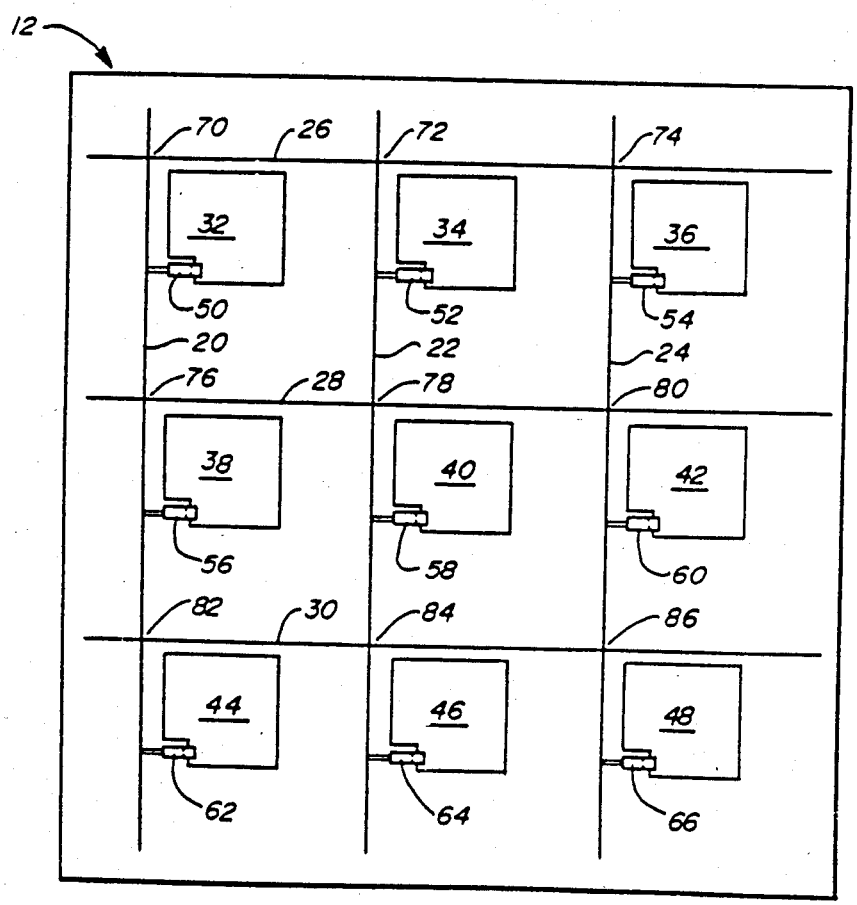
FIG. 2 is a top plan view of the contact-type scanner of FIG. 1 with the document removed.

FIGS. 1 and 2 illustrate a contact-type document scanner system and apparatus embodying the present invention. The system 10 illustrated in FIG. 1 generally includes an apparatus 12 capable of providing electrical signals representative of an image carried by an image-bearing member such as a document 14 disposed thereover, and a light source 16.

The apparatus 12 includes a transparent substrate 18, a first set of X address lines including address lines 20, 22, and 24, a second set of Y address lines including address lines 26, 28, and 30, and a plurality of light sensitive elements 32, 34, 36, 38, 40, 42, 44, 46, and 48. The apparatus 12 further includes an isolation device 50, 52, 54, 56, 58, 60, 62, 64, and 66 associated with each light sensitive element, and, a transparent cover means 68.

As can be noted in FIG. 2, the X address lines 20, 22, and 24 and the Y address lines 26, 28, and 30 cross at an angle, and, as will be more apparent hereinafter, are spaced from one another to form a plurality of crossover points 70, 72, 74, 76, 78, 80, 82, 84, and 86. Associated with each of the crossover points is a respective one of the light sensitive elements. The light sensitive elements 32–48 are formed on the substrate 18 and are distributed thereover in spaced apart relation to form spaces 88 between the light sensitive elements. The light sensitive elements 32–48 are further of the type which effects a detectable electrical characteristic in response to the receipt of light thereon. As will be more fully described hereinafter, the light sensitive elements 32–48 can comprise photovoltaic cells or photoresistors which effect a detectable change in electrical conductivity in response to the receipt of incident light thereon. The light sensitive elements are preferably formed from a deposited semiconductor material, such as an amorphous semiconductor alloy. Preferably, the amorphous semiconductor alloy includes silicon and hydrogen and/or fluorine. Such alloys can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent To Crystalline Semiconductors Produced By A Glow Discharge Process.

Each of the isolating devices 50–66 is associated with a respective one of the light sensitive elements 32–48. The isolation devices are also preferably formed from a deposited semiconductor material, and most preferably, an amorphous semiconductor alloy including silicon. The amorphous silicon alloy can also include hydrogen and/or fluorine and can be deposited by plasma-assisted chemical vapor deposition as disclosed in the aforementioned U.S. Pat. No. 4,226,898. As can be noted in FIG. 2, each of the isolation devices 50–66 is coupled in series relation with its associated light sensitive element 32–48 between respective pairs of the X address lines 20, 22, and 24 and the Y address lines 26, 28, and 30. As a result, the isolation devices facilitate the selective addressing and detection of the electrical conductivity of each of the light sensitive elements by the application of read potentials to respective pairs of the X and Y address lines.

Referring now more particularly to FIG. 1, as can there be noted, the light source 16 comprises a plurality of individual light sources 90, 92, and 94. Associated with each of the sources 90, 92, and 94 is a reflector 96, 98, and 100. The light sources 90, 92, and 94 and the reflectors 96, 98, and 100 are arranged to provide diffuse light indicated by the arrows 102 which is projected onto the apparatus 12 on the side of the substrate 18 opposite the light sensitive elements and the document 14 to be scanned. The document 14 is disposed over the transparent cover 68 which includes a substantially planar surface 104. The document 14 includes at least one portion 106 of high optical density, hereinafter referred to as the dark portions of the document, and portions 108 which are low optical density, and are hereinafter referred to as the light portions of the document. The cover 68 is preferably relatively thin so that the document 14 is closely spaced in juxtaposed relation to the light sensitive elements, such as, light sensitive elements 44, 46, and 48 illustrated in FIG. 1, for proximity focusing the image on document 14 onto the light sensitive elements. The thickness of the cover 68 is chosen to give maximum useable signal consistent with a number of other variable parameters. These parameters include the angular distribution of the diffuse light intensity, the width of the light sensitive elements, and the spacing between the light sensitive elements. Preferably, the thickness of the cover 68, the width of the light sensitive elements, and the spacing between the light sensitive elements are all of comparable dimension.

The cover 68 is adhered to the substrate 18 by a transparent adhesive 110. The adhesive 110 is preferably a material having an index of refraction which matches the index of refraction of the substrate 18 to that of the cover 68 to minimize the reflection from the surface boundaries bordered by the matching material.

When the document 14 is to be scanned, it is first placed over the apparatus 12 in substantial contact with the planar surface 104 of the transparent cover 68 so that the document is disposed in closely spaced juxtaposed relation to the light sensitive elements. Then, the light source 16 is energized for projecting the diffuse light 102 onto the back side of the apparatus 12. The diffuse light is thereby projected onto the surface of the document 14 adjacent the planar surface 14. In the dark portions 106 of the document 14, the light will be substantially absorbed so that very little of the light impinging upon the dark portions 106 will be reflected back onto the light sensitive elements adjacent thereto, for example, light sensitive elements 44 and 46. However, the light striking the light portions 108 will not be substantially absorbed and a substantially greater portion of the light impinging upon the light portions 108 of the document will be reflected back onto the light sensitive elements adjacent thereto, such as light sensitive element 48. The light sensitive elements adjacent the light portions 108 of the document will thereby effect a detectable change in their electrical conductivity. When the light sensitive elements are formed from photovoltaic cells, they will not only effect a change in electrical conductivity, but will also generate current. When the light sensitive elements are photoresistors, they will effect an increased electrical conductivity which can be detected by the application of read potentials to the respective pairs of the X address lines 20, 22, and 24, and the Y address lines 26, 28, and 30.

Electrical signals representing a faithful reproduction of the document 14 can be obtained because the light sensitive elements 32-48 can be made very small. For example, the light sensitive elements can be made to have dimensions of approximately 90 microns on a side. The isolating devices 50-66 can be formed to have a dimension of about 10-40 microns on a side and preferably 20 microns on a side. Also, the light sensitive elements 32-48 can be spaced apart so that they cover only a portion of the substrate 12 to permit the light to be projected onto the document to be scanned. For example, the light sensitive elements can be spaced so that they cover about 25-50% of the overall surface area of the substrate 18. Also, the light sensitive elements can be arranged in substantially coplanar relation so that each will be equally spaced from the document to be scanned. Although FIG. 2 illustrates a 3×3 matrix of light sensitive elements, it can be appreciated that a much larger array of elements would be required in actual practice for scanning a document.

The electrical characteristic, and, in accordance with this preferred embodiment, the electrical conductivity of the light sensitive elements can be detected by applying read potentials to respective pairs of the X and Y address lines in series, and one at a time. However, and most preferably, the light sensitive elements can be divided into groups of elements and the read potentials can be applied to each group of elements in parallel to facilitate more rapid scanning of the document. Within each group of elements, the elements can be scanned in series.

Figure 3:
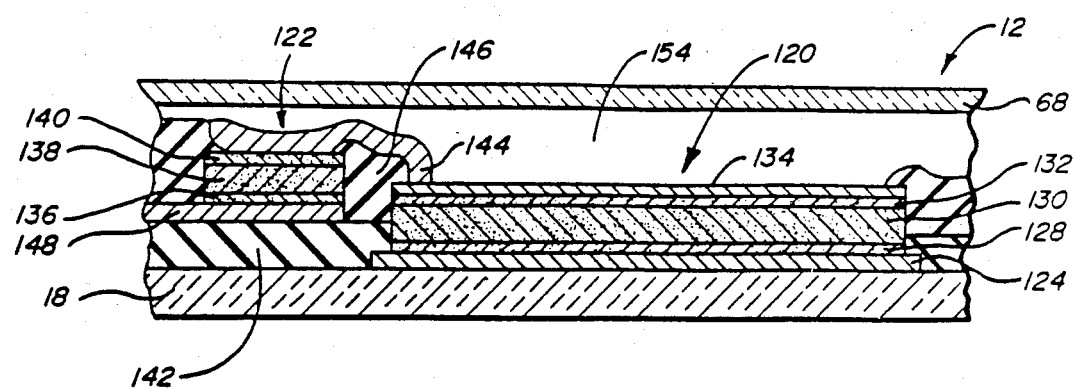
FIG. 3 is a partial cross-sectional side view illustrating a light sensitive element and an isolating device associated therewith embodying the present invention.
Figure 4:
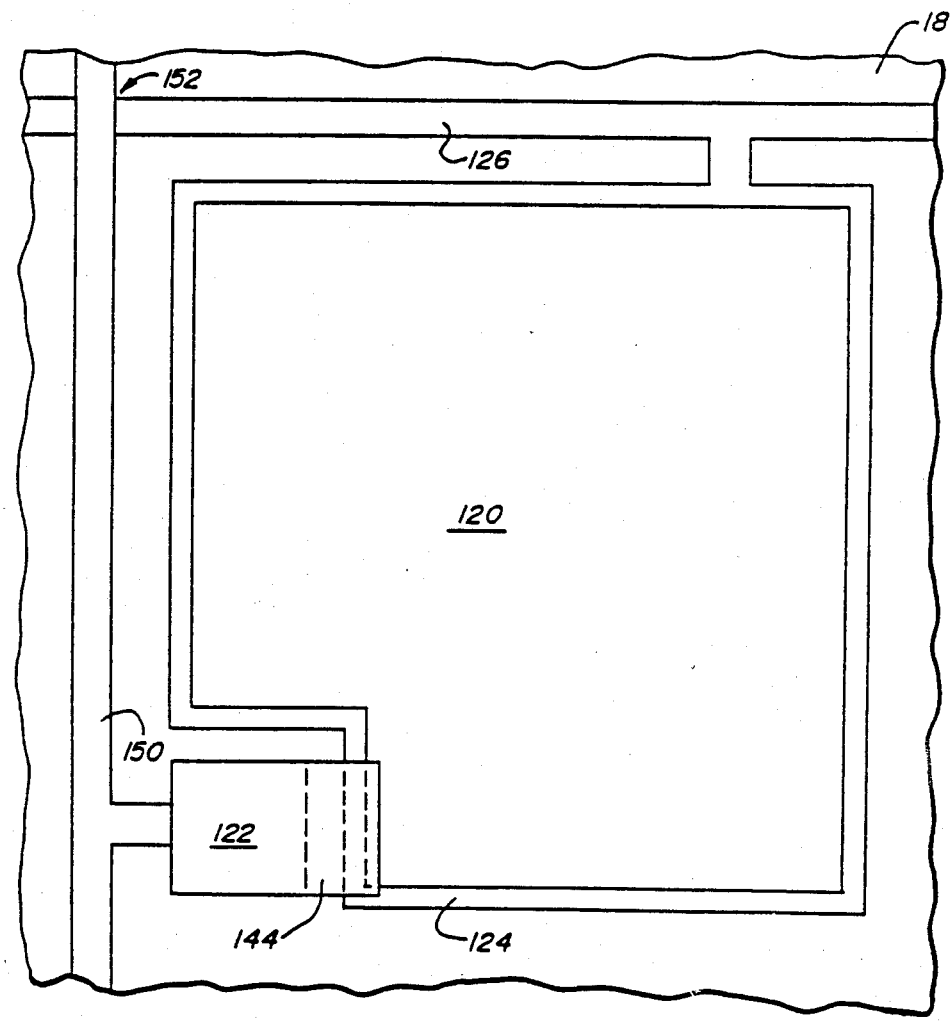
FIG. 4 is a top plan view of the light sensitive element and isolating device of FIG. 3.

Referring now to FIGS. 3 and 4, they illustrate in greater detail a configuration of light sensitive element 120 and isolation device 122 in accordance with the present invention. Here, the apparatus 12 includes the transparent or glass substrate 18. Formed on the substrate 18 is a metal pad which is electrically connected to a Y address line 126. The metal pad 124 can be formed from aluminum, chromium, or molybdenum, for example.

Formed on the metal pad 124 is the light sensitive element 120 which can take the form of a photovoltaic cell. The photovoltaic cell or light sensitive element 120 can include an amorphous silicon alloy body having a first doped region 128, an intrinsic region 130, and a second doped region 132. The regions 128 and 132 are preferably opposite in conductivity wherein the region 128 is p-type and the region 132 is n-type. Overlying the n-type region 132 is a layer of a transparent conductor 134. Photovoltaic cells of this type are fully disclosed, for example, in the aforementioned U.S. Pat. No. 4,226,898 and therefore need not be described in detail herein.

The metal pad 124 not only forms an ohmic contact with the light sensitive element 120 but in addition, serves to block light from reaching the back side of the light sensitive element. This function of the metal pad 124 is particularly important when the scanning system is to be used in accordance with the embodiment illustrated in FIG. 1.

The isolation device 122, in accordance with this embodiment, comprises a diode, also formed from an amorphous silicon alloy having a p-type region 136, an intrinsic region 138, and an n-type region 140. The diode 122 is also formed on a metal pad 148 which is formed on a layer of a deposited insulator 142 which can be formed from, for example, silicon oxide or silicon nitride. The diode 122 can be formed during the same deposition as the photovoltaic device 120.

The diode 122 is coupled to the photovoltaic cell 120 by an interconnect lead 144. Separating the diode 122 from the photovoltaic cell 120 is a deposited insulator 146 which can also be formed from silicon oxide or silicon nitride.

The metal pad 148 is coupled to an X address line 150. As can be noted in FIG. 3, the X address line 150 and the Y address line 126 are spaced apart by the insulating layer 142. Because the address lines cross at an angle and are separated from one another, an insulated crossover point 152 is thereby formed.

The structure of FIG. 3 is completed by the transparent cover member 68 which can be formed from glass. It is disposed over the diode and light sensitive element and is adhered thereto by a transparent adhesive which can fill the space 154. As previously mentioned, the transparent adhesive preferably has an index of refraction which matches the index of refraction of the glass substrate 18 to that of the cover member 68.

Figure 5:
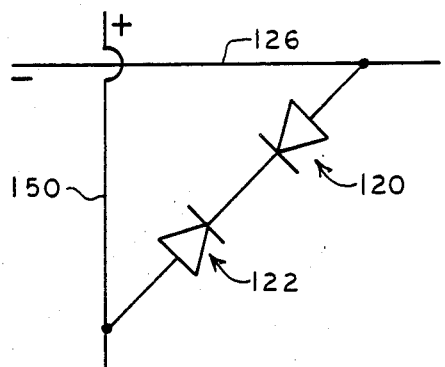
FIG. 5 is an equivalent circuit diagram of the light sensitive element and isolating device of FIG. 3.

Referring now to FIG. 5, it illustrates the equivalent circuit diagram of the light sensitive element 120, the isolating diode 122, and the address lines 126 and 150. It can be noted that the interconnect lead 144 connects the cathodes of the photovoltaic cell 120 and diode 122 together. The anode of the diode 122 is coupled to the X address line 150 and the anode of the photovoltaic cell 120 is coupled to the Y address line 126.

In order to read the electrical characteristic of the photovoltaic cell 120, a positive potential is applied to the X address line 150 and a negative potential is applied to the Y address line 126. This forward biases the isolating diode 122. If light is being reflected off of a light portion of the document being scanned onto the photovoltaic cell 120, a photogenerated current will be produced within the cell 120 and will be detected through the forward biased diode 122. However, if the cell 120 is adjacent one of the dark portions of the document, substantially no photogenerated current will be produced by the cell 120. The difference between the two current levels can therefore be contrasted for deriving an electrical signal representative of the image adjacent the cell 120.

Figure 6:
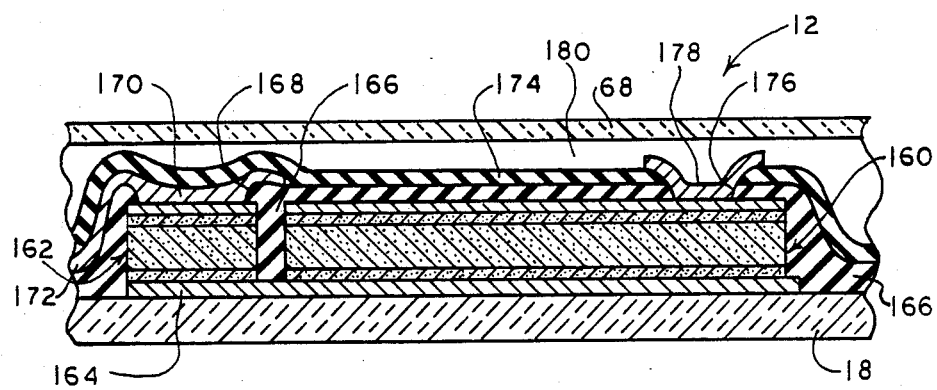
FIG. 6 is a partial cross-sectional side view of another light sensitive element and isolating device structured in accordance with a further embodiment of the present invention.

Referring now to FIG. 6, it illustrates another light sensitive element and isolation device configuration embodying the present invention. Here again, the apparatus 12 includes a transparent substrate 18 which can be formed from glass. The apparatus 12 also includes a photovoltaic cell 160 and an isolating diode 162. The light sensitive element or cell 160 and the diode 162 can be identical to the isolating diode 122 and the cell 120 disclosed with respect to FIG. 3.

The diode 162 and light sensitive element or cell 160 are formed on a conductive metal pad 164. The diode 162 and cell 160 are separated by a deposited insulator which again can be formed from silicon oxide or silicon nitride. Formed in the insulator 166 is an opening 168 which permits a metal lead 170 to be formed in contact with the diode 162 and with an X address line 172. Overlying the insulator 166 and the conductor 170 is another layer of insulator 174. Formed in the insulating layers 166 and 174 is an opening 176 which permits the formation of another metal lead 178 to form a Y address line. The structure of FIG. 6 is completed by the transparent cover 68 and a transparent adhesive filling the space 180.

Figure 7:
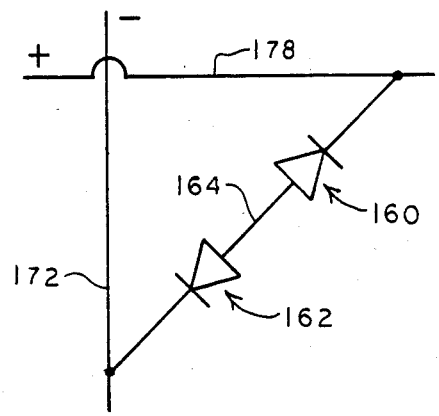
FIG. 7 is the equivalent circuit diagram of the light sensitive element and isolating device of FIG. 6.

FIG. 7 illustrates the equivalent circuit of the structure of FIG. 6. Because the diode 162 and light sensitive element or cell 160 are formed on a common metal pad 164, the anodes of the diode 162 and cell 160 are coupled together. The cathode of the cell 160 is coupled to the Y address line 178 and the cathode of the diode 162 is coupled to the X address line 172. To read the condition of the cell 160, a negative potential is applied to the X address line 172 and a positive potential is applied to the Y address line 178 to forward bias diode 62. With diode 162 forward biased, the electrical conductivity for photogenerated current of cell 160 can be detected for deriving an electrical signal representative of the light or dark image portion adjacent the cell 160.

Figure 8:
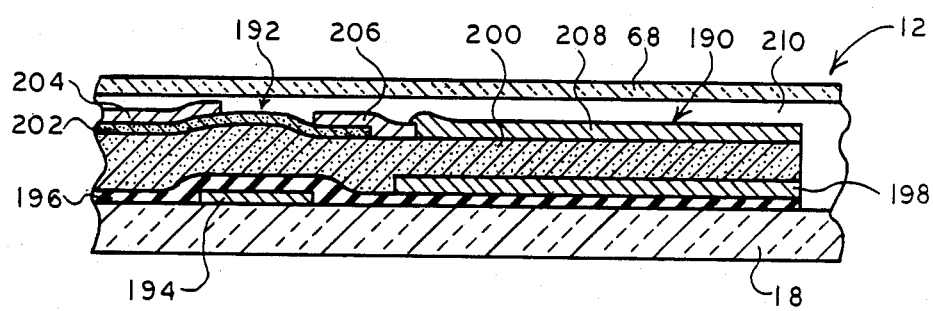
FIG. 8 is a partial cross-sectional side view of another light sensitive element and isolating device embodying the present invention.

Referring now to FIG. 8, it illustrates a further configuration of light sensitive element 190 and isolation device 192. Here, the light sensitive element takes the form of a photoresistor and the isolating device 192 takes the form of a thin film field effect transistor.

The apparatus 12 illustrated in FIG. 8 includes a transparent substrate 18, which can be formed from glass, for example. The gate of the thin film field effect transistor 192 is first formed on the substrate 18. A layer of insulating material 196 is then deposited over the gate 194 and the substrate 18. A metallic pad 198 is then formed over the insulator 196 to form one contact of the light sensitive element or photoresistor 190.

A substantially intrinsic amorphous silicon alloy layer 200 is then deposited as shown for forming the semiconductor of the thin film field effect transistor 192 and the semiconductor of the photoresistor 190. A layer 202 of n-type amorphous silicon can then be formed over the intrinsic amorphous silicon alloy 200 to enhance the ohmic contact between the source and drain electrodes 204 and 206 with the amorphous silicon alloy 200. A layer of a transparent conductor 208 can be formed over the amorphous silicon alloy 200 in contact with the transistor electrode 26 and in a corresponding configuration to the metal pad 198 to form the top contact of the photoresistor 190. The structure of FIG. 8 is completed with the transparent cover 68 which can be formed from glass and a transparent adhesive filling the space 210 as previously described.

Figure 9:
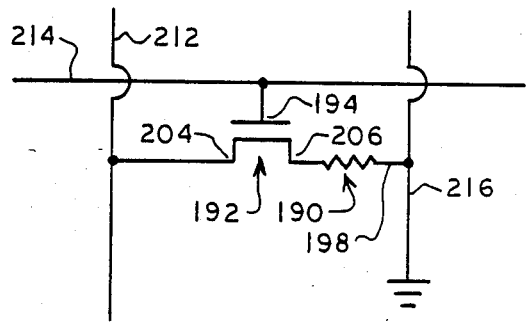
FIG. 9 is the equivalent circuit diagram of the light sensitive element and isolating device of FIG. 8.

As will be noted in FIG. 8, the gate 194, the electrode 204, and the bottom contact 198 of the photoresistor 190 are all vertically separated from one another. As a result, each of these elements can be connected to respective address lines while being insulated from one another. FIG. 9 shows the equivalent circuit diagram of the structure of FIG. 8.

In FIG. 9, it can be noted that the electrode 204 of the thin film field effect transistor 192 is coupled to an X address line 212. The gate 194 of the transistor 192 is coupled to a Y address line 214. The bottom contact 198 of the photoresistor 190 is coupled to a common potential such as ground by a lead 216. As a result, the electrical conductivity of the photoresistor 190 can be sensed by the application of suitable potentials to the electrode 204 and gate 194 for turning the transistor 192 on. If light is being reflected off of a light portion of a document onto the photoresistor 190, a current will flow between the transistor electrodes 204 and 206 which can be sensed on the X address lead 212. However, if the photoresistor 190 is immediately adjacent a dark portion of the document, very little light will be projected onto the photoresistor 190 so that substantially no current will flow from the electrode 204 to the electrode 206. In this manner, the condition of the photoresistor 190 can be detected.

In accordance with the present invention, electrical signals can be provided which represent the color hues of an image. For example, each of the light sources 96, 98, and 100 can include three separate light sources each being arranged to emit light of a different primary color of red, green, and blue. To generate the electrical signals representative of the color hues of the image, the image-bearing member 14 can be sequentially exposed to red, green, and blue light. During each exposure, the light sensitive elements can be addressed. For example, when the document 14 is exposed to the red light, those image portions thereof which include a red color component will reflect red light onto the light sensitive elements adjacent thereto. These elements will effect a greater change in electrical conductivity than those elements adjacent image portions which do not include a red color component. After this procedure is performed for each of the red, green, and blue primary colors, the three electrical signals provided from each light sensitive element can be combined to derive both intensity and color hue of the image.

From the foregoing, it can be appreciated that the present invention provides a new and improved apparatus for providing electrical signals representative of an image projected thereon. As can be appreciated from the foregoing, the light sensitive elements can be formed from photovoltaic cells or photoresistors which exhibit a detectable change in an electrical characteristic such as electrical conductivity upon receipt of incident light thereon. The isolating devices can take the form of diodes or thin film field effect transistors, for example, and any combination of such light sensitive elements and isolating devices are possible.

The apparatus of the present invention exhibits distinct advantages over similar apparatuses of the prior art. For example, the document scanner of the present invention has no moving parts which would otherwise be subject to wear and frequent servicing. Also, the document can be electrically read at a faster rate than that possible with prior art scanners, especially when the light sensitive elements are read in parallel. Also, because the apparatus of the present invention does not require servo mechanisms or driving motors, the document scanners of the present invention can be made substantially smaller and lighter to enhance the portability thereof.

We claim:

1. An apparatus capable of providing electrical signals representative of an image on an image-bearing member, comprising:
   a first plurality of address lines;
   a second plurality of address lines electrically insulated from and arranged at angle to said first plurality of address lines;
   a photosensitive array arranged to scan said image, said array including a plurality of light sensitive elements arranged in spaced apart relation adjacent to a common surface, each said element being adapted to effect a detectable electrical characteristic responsive to the intensity of incident light and being coupled to one address line of one of said plurality of address lines;
   isolation means associated with each said light sensitive element for facilitating selective addressing of said light sensitive elements by the application of read potentials to respective pairs of said first and second pluralities of address lines; and
   a transparent cover overlying said light sensitive elements, said cover including a surface opposite said light sensitive elements arranged for receiving said image-bearing member in juxtaposed relation to said light sensitive elements for proximity focusing said image onto said array.

2. An apparatus as defined in claim 1 wherein said light sensitive elements comprise photovoltaic cells.

3. An apparatus as defined in claim 1 wherein said light sensitive elements comprise photoresistors.

4. An apparatus as defined in claim 1 wherein said light sensitive elements are formed from deposited semiconductor material.

5. An apparatus as defined in claim 4 wherein said deposited semiconductor material is an amorphous semiconductor alloy.

6. An apparatus as defined in claim 5 wherein said amorphous semiconductor alloy includes silicon.

7. An apparatus as defined in claim 6 wherein said amorphous semiconductor alloy further includes hydrogen.

8. An apparatus as defined in claim 6 wherein said amorphous semiconductor alloy further includes fluorine.

9. An apparatus as defined in claim 5 wherein said light sensitive elements comprise photovoltaic cells including a first doped region, a substantially intrinsic region, and a second doped region of opposite conductivity with respect to said first doped region.

10. An apparatus as defined in claim 1 wherein said isolation devices comprise diodes.

11. An apparatus as defined in claim 10 wherein said diodes are formed from deposited semiconductor material.

12. An apparatus as defined in claim 11 wherein said deposited semiconductor material is an amorphous semiconductor alloy.

13. An apparatus as defined in claim 12 wherein said amorphous semiconductor alloy includes silicon.

14. An apparatus as defined in claim 13 wherein said amorphous semiconductor alloy further includes hydrogen.

15. An apparatus as defined in claim 13 wherein said amorphous semiconductor alloy further includes fluorine.

16. An apparatus as defined in claim 12 wherein said diodes include a first doped region, a substantially intrinsic region, and a second doped region of opposite conductivity with respect to said first doped region.

17. An apparatus as defined in claim 1 wherein said isolation devices comprise thin film transistors.

18. An apparatus as defined in claim 17 wherein said thin film transistors are thin film field effect transistors.

19. An apparatus as defined in claim 18 wherein said thin film field effect transistors include a gate electrode, a source electrode, and a drain electrode, wherein said gate electrodes are coupled to one of said address lines of one of said plurality of address lines, wherein either said drain or source electrodes are coupled to one of said address lines of said other plurality of address lines, and wherein the other of said drain or source electrodes are coupled to one of said light sensitive elements.

20. An apparatus as defined in claim 19 wherein said light sensitive elements are also coupled to a common potential.

21. An apparatus as defined in claim 1 wherein said thin film field effect transistors include deposited semiconductor material.

22. An apparatus as defined in claim 21 wherein said deposited semiconductor material is an amorphous semiconductor alloy.

23. An apparatus as defined in claim 22 wherein said amorphous semiconductor alloy includes silicon.

24. An apparatus as defined in claim 23 wherein said amorphous semiconductor alloy further includes hydrogen.

25. An apparatus as defined in claim 23 wherein said amorphous semiconductor alloy further includes fluorine.

26. An apparatus as defined in claim 1 wherein said common surface defines a substantially common plane.

27. An apparatus as defined in claim 26 wherein said surface of said cover is substantially planar and said proximity focusing is achieved by having the thickness of said cover, the width of said light-sensitive elements, and the spacing between adjacent light sensitive elements be of comparable dimension.

28. An apparatus as defined in claim 1 further including a light source arranged for projecting light onto said image-bearing member on the side thereof immediately adjacent said cover.

29. An apparatus as defined in claim 28 wherein said light source is arranged for projecting diffuse light.

30. An apparatus as defined in claim 28 wherein said light source is arranged for sequentially projecting light of different colors onto said image-bearing member.

31. An apparatus as defined in claim 30 wherein said light source is arranged for projecting red, green, and blue light onto said image-bearing member.

32. An apparatus for providing electrical signals representative of an image having light and dark portions carried by an image-forming member, said apparatus comprising:
   a transparent substrate;
   a first set of address lines;
   a second set of address lines spaced from and crossing at an angle to said first set of address lines to form a plurality of crossover points;
   a plurality of light sensitive elements formed and distributed on said substrate in spaced apart relation, each light sensitive element being associated with a given one of said crossover points and arranged to effect a detectable change in an electrical characteristic in response to receipt of incident light;
   an isolation device associated with each said light sensitive element to facilitate the selective addressing and detection of the changeable electrical characteristic of each said light sensitive element by the application of read potentials to respective pairs of said first and second sets of address lines; and
   transparent cover means for proximity focusing of said image on said light sensitive elements, said cover means overlying said light sensitive elements and including a substantially planar surface opposite said light sensitive elements for receiving said image-bearing member thereon in close juxtaposed relation to said light sensitive elements.

33. An apparatus as defined in claim 32 wherein said light sensitive elements comprise photovoltaic cells.

34. An apparatus as defined in claim 32 wherein said light sensitive elements comprise photoresistors.

35. An apparatus as defined in claim 32 wherein said light sensitive elements are formed from deposited semiconductor material.

36. An apparatus as defined in claim 35 wherein said deposited semiconductor material is an amorphous semiconductor alloy.

37. An apparatus as defined in claim 32 wherein said isolation devices comprises diodes.

38. An apparatus as defined in claim 32 wherein said isolation devices comprise field effect transistors.

39. An apparatus as defined in claim 32 wherein said isolation devices are formed from deposited semiconductor material.

40. An apparatus as defined in claim 39 wherein said deposited semiconductor material is an amorphous semiconductor alloy.

41. An apparatus as defined in claim 32 wherein said substrate and said cover means are formed from glass.

42. An apparatus as defined in claim 32 further including a transparent material overlying said substrate and said light sensitive elements between said substrate and said cover means.

43. An apparatus as defined in claim 42 wherein said transparent material bonds said cover means to said light sensitive elements and substrate and has an index of refraction which closely corresponds to the index of refraction of said substrate and to the index of refraction of said cover means, thereby minimizing reflection at surface boundaries of said transparent material.

44. An apparatus as defined in claim 32 further including a light source arranged for projecting light through said transparent substrate and between said light sensitive elements onto said image-bearing member on the side thereof immediately adjacent said planar surface of said cover means.

45. An apparatus as defined in claim 44 wherein said light source is arranged for projecting diffuse light.

46. An apparatus as defined in claim 44 wherein said light source is arranged for projecting light of different colors onto said image-bearing member.

47. An apparatus as defined in claim 46 wherein said light source includes red, blue, and green light sources.

48. A method of generating electrical signals representative of an image, said method including the steps of:
   providing an array of light sensitive elements in spaced apart relation, each element being capable of effecting a detectable change in an electrical characteristic responsive to the receipt of light thereon;
   projecting said image onto said array of light sensitive elements;
   selectively applying read potentials to said light sensitive elements for detecting the changeable electrical characteristic of said elements and deriving an electrical signal for each element representative of the intensity of light received by each said element; and
   dividing said elements into groups of elements, and wherein said read potentials are applied to each said group of elements in parallel while said image is projected onto said array of elements.

49. A method as defined in claim 48 wherein said read potentials are serially applied to said elements within each said group of elements.

50. A method of generating electrical signals representative of an image formed by high and low optical density portions on one side of said image-bearing member, said method including the steps of:

providing an array of light sensitive elements capable of effecting a detectable change in an electrical characteristic responsive to the receipt of light thereon in spaced apart substantially coplanar relation;

placing said image-bearing member over and in closely spaced juxtaposed relation to said array of elements with said one side of said member adjacent said array of elements;

projecting diffuse light through the spaces between said elements onto said one side of said member so that the image portions of low optical density reflect light onto said elements adjacent thereto and the image portions of high optical density reflect substantially less light onto said elements adjacent thereto than reflected by said portions of low optical density; and selectively applying read potentials to said light sensitive elements for detecting the electrical characteristic of said elements and deriving an electrical signal for each element representative of the optical density of the image portion adjacent thereto.

51. A method as defined in claim 50 wherein said read potentials are serially applied to said elements one at a time while said image is projected onto said array of elements.

52. A method as defined in claim 51 including the further step of dividing said elements into groups of elements, and wherein said read potentials are applied to each said group of elements in parallel while said image is projected onto said array of elements.

53. A method as defined in claim 52 wherein said read potentials are serially applied to said elements within each said group of elements.

54. A method as defined in claim 50 including the further step of sequentially projecting different colored light onto said image-bearing member.

55. A method as defined in claim 54 wherein said light is red, green, and blue light.

56. An apparatus for providing electrical signals representative of an image projected thereon, said system comprising:

an array of spaced apart light sensitive elements each element including a photovoltaic cell formed from a body of three stacked thin film layers of semiconductor material vertically arranged in a p-i-n configuration, each said cell having a top electrode formed from a transparent conductive layer above and coextensive with its body, said elements being arranged for receiving said image, and said elements being capable of effecting a detectable electrical characteristic responsive to the intensity of light received thereon from said image; and isolation means for enabling the selective detection of said electrical characteristic of each said element, said isolation means including a diode associated with each said light sensitive element, formed from a body of three stacked thin film layers of semiconductor material arranged in a p-i-n configuration, each said diode having a top electrode formed from a conductive layer above and coextensive with its body.

57. An apparatus as defined in claim 56 wherein said electrical characteristic is the electrical conductivity of said elements.

58. An apparatus as defined in claim 56 wherein said image is carried on one side of an image-bearing member and said apparatus further comprises a transparent cover means for proximity focusing of said image on said array, said cover means including a surface arranged to receive said image-bearing member in closely spaced juxtaposed relation to said array of light sensitive elements.

59. An apparatus as defined in claim 58 wherein said light sensitive elements are arranged in substantially coplanar relation.

60. An apparatus as defined in claim 59 further including a light source for projecting light through the spaces between said elements, through said transparent cover means, and onto said one side of said image-bearing member for projecting said image onto said array of elements.

61. An apparatus as defined in claim 60 wherein said light source is arranged for projecting diffuse light.

62. An apparatus as defined in claim 60 wherein said light source is arranged for projecting red, green, and blue light onto said image-bearing member.

63. An apparatus as defined in claim 56 further comprising:

a substrate upon which said array of light sensitive elements and said isolation means are formed; and a plurality of spaced apart conductive pads formed on said substrate, with one such pad for each light sensitive element, and wherein each photovoltaic cell and its associated diode are formed on and electrically connected to one of said metal pads from commonly deposited thin film layers of semiconductor material.

64. An apparatus as defined in claim 63 wherein said substrate is transparent and said pads are opaque.

65. An apparatus as defined in claim 56 wherein at least one of the semiconductor layers of each photovoltaic cell and each diode is an amorphous semiconductor material.

66. An apparatus as defined in claim 65 wherein said amorphous semiconductor material is an amorphous silicon alloy.

67. An apparatus as defined in claim 65 wherein said pads are metal.

68. Apparatus capable of providing electrical signals representative of an image on an image-bearing member, comprising:

a photosensitive array of at least one column of discrete, non-light transmissive, light sensitive elements, each element adapted to scan a portion of said image and affect a detectable electrical characteristic responsive to the intensity of light incident thereon; and each element formed from non-single crystal deposited semiconductor material and including first and second electrodes;

means for addressing a first electrode of each of said elements, said addressing means disposed in a first plane;

a plurality of lines adapted to discretely address a second electrode of said elements, said lines disposed in a second plane substantially parallel to said first plane;

means operatively disposed relative to one of said electrodes of each of said elements for spacedly positioning said image-bearing member in close juxtaposed relation to said elements such that portions of said image may be proximity focused onto corresponding elements of said array; and isolation means associated with each of said elements for facilitating selective addressing of said elements by the application of read potentials to said address means and said address lines.

69. Apparatus as in claim 68 where said light sensitive elements comprise photovoltaic cells.

70. Apparatus as in claim 68 wherein said light sensitive elements comprise photoresistors.

71. Apparatus as in claim 70 wherein said semiconductor material is amorphous.

72. Apparatus as in claim 71 wherein said amorphous semiconductor alloy includes at least one density of state reducing element selected from the group consisting of hydrogen and fluorine.

73. Apparatus as in claim 71 wherein said amorphous semiconductor alloy further includes silicon.

74. Apparatus as in claim 68 wherein said light sensitive elements comprise photovoltaic cells including a first doped region, a substantially intrinsic region, and a second doped region of opposite conductivity with respect to said first doped region.

75. Apparatus as in claim 68 wherein each of said isolation means comprise diodes.

76. Apparatus as in claim 75 wherein said diodes include a first doped region, a substantially intrinsic region, and a second doped region of opposite conductivity with respect to said first doped region.

77. Apparatus as in claim 68 wherein said isolation devices comprise thin film transistors.

78. Apparatus as in claim 77 wherein said thin film transistors are field effect transistors.

79. Apparatus as in claim 78 wherein said light sensitive elements are also coupled to a common potential.

80. Apparatus as in claim 68 wherein said light sensitive elements are disposed in a substantially common plane.

81. Apparatus as in claim 80 wherein said light transmissive layer comprises a transparent cover member overlying said light sensitive elements.

82. Apparatus as in claim 81 wherein said light source means is arranged for sequentially projecting light of different colors onto said image-bearing member.

83. Apparatus as in claim 82 wherein said source means is adapted to project red, green, and blue light.

84. Apparatus as in claim 68 wherein said positioning means includes a layer of light transmissive material overlying and bonded to said light sensitive elements.

85. Apparatus as in claim 68 further including light source means for projecting light onto said image-bearing member on the side thereof closest to said positioning means.

86. Apparatus as in claim 85, wherein said light source means is arranged for projecting diffuse light.

87. Apparatus as in claim 68, wherein:
said isolation devices associated with each of said elements comprise diodes; and, each of said light sensitive elements and said diodes includes a semicounductor body formed of stacked thin film layers including a first doped layer having a first conductivity type, a substantially intrinsic layer, and a second doped layer having a second conductivity type opposite to that of said first doped layer.

88. Apparatus as in claim 87 further comprising a substrate over which said light sensitive elements and said diodes are formed, and wherein the order of said stacked thin layers forming the semiconductor body each light sensitive and diode is the same, such that each semiconductor body has its first doped layer located closer to said substrate than its second doped layer.

89. Apparatus as in claim 88 wherein the first electrodes of said light sensitive elements are each formed upon said substrate as a distinct substantially opaque, thin film conductive pad, and the semiconductor bodies of each light sensitive element and its associated isolation diode are formed upon and electrically interconnected by the opaque conductive pad of said light sensitive element.

90. Apparatus as in claim 89 wherein said substrate is transparent and the opaque conductive pads of said photosensitive elements are arranged in spaced relation to one another to permit light passing through said substrate and between and around said conductive pads to illuminate the portions of said image on said image-bearing member being scanned.

91. Apparatus capable of providing electrical signals representative of an image on an image-bearing member, said apparatus including a photosensitive array of deposited semiconductor light sensitive elements, each of said elements being non-light transmissive, non-apertured, continuous and adapted to receive light from a corresponding small area portion of said image-bearing member and generate a detectable signal therefrom representative of the intensity of received light, the improvement comprising in combination:
said array including at least one column of light sensitive elements operatively disposed so as to cover at least a portion of at least one dimension of said image-bearing member; and
spacing means for closely positioning said light sensitive elements in juxtaposed relation relative to said image-bearing member so as to proximity focus light onto said light sensitive elements from corresponding small area portions of said member.

92. Apparatus as in claim 91 wherein the deposited semiconductor is selected from the group consisting essentially of silicon, germanium or combinations thereof.

93. Apparatus as in claim 92 wherein said light sensitive elements comprise P-I-N photovoltaic cells.

94. Apparatus as in claim 92 wherein said light sensitive elements comprise P-I-N photoresistors.

95. Apparatus as in claim 92 wherein said deposited semiconductor is amorphous.

96. Apparatus as in claim 92 wherein said deposited semiconductor includes at least one density of states reducing element selected from the group consisting essentially of hydrogen and fluorine.

97. Apparatus as in claim 91 wherein said light sensitive elements are coupled to a common potential.

98. Apparatus as in claim 91 wherein said light sensitive elements are disposed in a substantially common plane.

99. Apparatus as in claim 91 wherein said positioning means includes a layer of light transmissive material overlying and bonded to said light sensitive elements.

100. Apparatus as in claim 91 wherein said positioning means includes a transparent cover overlying said light sensitive elements.

101. Apparatus as in claim 91 further including light source means for illuminating said image-bearing member.

102. Apparatus as in claim 101, wherein said light source means is disposed on the same side of the image-bearing member as the light sensitive elements.

103. Apparatus as in claim 102, wherein said image-bearing member is transparent and said light source means is disposed on the side of the image-bearing member opposite the light sensitive elements.

* * * * *